(12) United States Patent
Aktug et al.

(10) Patent No.: US 11,201,596 B2
(45) Date of Patent: Dec. 14, 2021

(54) POWER AMPLIFIER SYSTEM

(71) Applicant: ASELSAN ELEKTRONIK SANAYI VE TICARET ANONIM SIRKETI, Ankara (TR)

(72) Inventors: Ahmet Aktug, Ankara (TR); Ahmet Degirmenci, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 0 days.

(21) Appl. No.: 16/649,991

(22) PCT Filed: Jan. 30, 2018

(86) PCT No.: PCT/TR2018/050031
§ 371 (c)(1),
(2) Date: Mar. 24, 2020

(87) PCT Pub. No.: WO2019/151959
PCT Pub. Date: Aug. 8, 2019

(65) Prior Publication Data
US 2020/0244234 A1 Jul. 30, 2020

(51) Int. Cl.
*H03F 3/21* (2006.01)
*H03F 1/56* (2006.01)
(Continued)

(52) U.S. Cl.
CPC .............. *H03F 3/211* (2013.01); *H03F 1/56* (2013.01); *H03F 3/19* (2013.01); *H03F 3/602* (2013.01);
(Continued)

(58) Field of Classification Search
CPC ... H03F 3/211; H03F 1/56; H03F 3/19; H03F 3/602; H03F 3/72; H03F 2200/451
(Continued)

(56) References Cited

U.S. PATENT DOCUMENTS

| | | | |
|---|---|---|---|
| 6,288,606 B1* | 9/2001 | Ekman | H03F 1/3241 330/107 |
| 2004/0130391 A1* | 7/2004 | Kim | H03F 1/0277 330/51 |

(Continued)

FOREIGN PATENT DOCUMENTS

CN 103023441 A 4/2013

OTHER PUBLICATIONS

Hiroshi Okazaki et al., Band-Reconfigurable High-Efficiency Power Amplifier Using MEMS Switches, IEEE International Workshop on Radio-Frequency Integration Technology, 2005, pp. 83-86, Singapore.

*Primary Examiner* — Hafizur Rahman
(74) *Attorney, Agent, or Firm* — Bayramoglu L.aw Offices LLC (57) ABSTRACT

A power amplifier system which operates at a narrow band with high power and high efficiency or at a wide band is provided. Said power amplifier system comprises at least one high power amplifier; at least one connection line; at least one input block which receives at least one signal from an input, which is connected to said high power amplifier and connection line, which sends received signal to either high power amplifier or connection line and which amplifies the power of the signal sent to the connection line; and at least one high power asymmetric output switch, which is connected to said high power amplifier and connection line and which sends signals coming from said high power amplifier and connection line to an output.

19 Claims, 4 Drawing Sheets

(51) Int. Cl.
*H03F 3/19* (2006.01)
*H03F 3/60* (2006.01)
*H03F 3/72* (2006.01)

(52) U.S. Cl.
CPC ......... *H03F 3/72* (2013.01); *H03F 2200/451* (2013.01)

(58) Field of Classification Search
USPC .......................................................... 330/51
See application file for complete search history.

(56) References Cited

U.S. PATENT DOCUMENTS

| | | | |
|---|---|---|---|
| 2010/0291888 A1 | 11/2010 | Hadjichristos et al. | |
| 2013/0316663 A1* | 11/2013 | Kishigami | H03F 3/72 455/78 |
| 2016/0181984 A1 | 6/2016 | Petrucelli et al. | |

* cited by examiner

POWER AMPLIFIER SYSTEM

CROSS REFERENCES TO THE RELATED APPLICATIONS

This application is the national phase entry of International Application No. PCT/TR2018/050031, filed on Jan. 30, 2018, the entire contents of which are incorporated herein by reference.

TECHNICAL FIELD

The present invention is related to a power amplifier used for amplifying the power of different electrical signals.

BACKGROUND

Power amplifiers are used for amplifying the power of different electrical signals, such as radio frequency signals. Said power amplifiers are used in variety of the areas such as radars, jammers, wireless communication, and imaging. Therefore, power amplifiers have great importance especially in the defence industry.

First power amplifiers, which are developed around 1920's, comprise vacuum tubes for amplification purposes. Although such vacuum tube power amplifiers are still used, nowadays solid state power amplifiers, comprising semiconductor components, become more popular because of their performance and size advantages. Improvement in the semiconductor technology yields increased performance for the solid state power amplifiers. However, present power amplifiers still lack performance, especially not being able to operate with wide bands with high performance. In other words, when the bandwidth of the amplifier increases, output power, efficiency and gain performance of the system decrease.

In the known art, power amplifiers operate either with narrow band-high power or wide band-low power. Therefore, when a wide band-high power requirement is needed, such power amplifiers cannot be used. Moreover, in the known art, there are combined power amplifiers, which comprise two amplifiers working at different bands and a switch for controlling said amplifiers. In these applications, said switch activates one amplifier according to the input signal. Therefore, for different system requirements (such as required band), different amplifiers are activated and operation band of the power amplifier increases. However, since said applications use standard switches, low loss and optimum impedance cannot be provided during the high power mode and wide band cannot be provided during the low power mode. Therefore, because of the standard switch, disadvantages such as inefficient frequency bandwidth, high loss, performance loss of power/efficiency mode due to un-ideal system impedance may occur.

SUMMARY

In the present invention, a power amplifier system which operates at a narrow band with high power and high efficiency or at a wide band with lower power is provided. Said power amplifier system comprises at least one high power amplifier; at least one connection line; at least one input block which receives at least one signal from an input, which is connected to said high power amplifier and connection line, which sends received signal to either high power amplifier or connection line and which amplifies the power of the signal sent to the connection line; and at least one high power asymmetric output switch, which is connected to said high power amplifier and connection line and which sends signals coming from said high power amplifier and connection line to an output.

In the present application, by using input block, high power amplifier, high power asymmetric output switch and connection line together, power amplifier system is able to be operated either narrow band with high power and high efficiency or wide band with lower output power. Therefore, according to the system needs, input signal is amplified without reducing the output power and efficiency of the narrow band mode and without reducing the bandwidth in the wide band mode.

An object of the invention is to provide a power amplifier system for amplifying the power of different electrical signals.

The other object of the invention is to provide a power amplifier system operating at a narrow band with high power and high efficiency or at a wide band with reduced output power and reduced total power dissipation.

All the parts illustrated in the drawing are individually assigned a reference numeral and the corresponding terms of these numbers are listed as follows:

Signal input (I)
Signal output (O)
Input block (1)
First amplifier element (1a)
Forth switching element (1b)
Fifth switching element (1c)
Sixth switching element (1d)
Seventh switching element (1e)
High power amplifier (2)
Second amplifier element (2a)
High power asymmetric output switch (3)
First matching network (3a)
Second matching network (3b)
Third matching network (3c)
First switching element (3d)
Second switching element (3e)
Third switching element (3f)
Connection line (4)
Balancing line (5)

DETAILED DESCRIPTION OF THE EMBODIMENTS

Power amplifiers are used in different electronic devices for amplifying the power level of different signals. Said power amplifiers usually use semiconductor components for the amplification proposes. Because of the hardware limitations, power amplifiers are unable to operate at a wide band with high power, high efficiency and flat gain simultaneously. Therefore, in the present application, a power amplifier system operating at a narrow band with high power and high efficiency or at a wide band according to the system requirements is provided.

The power amplifier system of the present invention, exemplary view of which is shown in the FIGS. 1-4, comprises at least one high power amplifier (2); at least one connection line (4); at least one input block (1) which receives at least one signal from an input (I), which is connected to said high power amplifier (2) and connection line (4), which sends received signal to either high power amplifier (2) or connection line (4) and which amplifies the power of the signal sent to the connection line (4); and at least one high power asymmetric output switch (3), which is connected to said high power amplifier (2) and connection line (4) and which sends signals coming from said high power amplifier (2) and connection line (4) to an output (O). The power amplifier system of the present invention may further comprise at least one control unit for controlling the operation of the input block (1) and high power asymmetric output switch (3). Alternatively, operation of the input block (1) and high power asymmetric output switch (3) may be controlled by a system, in which the power amplifier system is used.

In an exemplary embodiment of the present application, an input signal coming from an input (I) is received by the input block (1). According to the characteristics of the input signal (such as frequency) and requirements of the system, said input block (1) directs the input signal to the high power amplifier (2) or the connection line (4). Said high power amplifier (2) provides narrow band, high efficiency and high power output. Therefore, when a narrow band with high power efficiency is needed, input signal is sent to the high power amplifier (2) and when wide band is needed, input signal is sent to the connection line (4). Signals coming from either the high power amplifier (2) or the connection line (4) reaches to the high power asymmetric output switch (3). Said high power asymmetric output switch (3) sends signal coming from either the high power amplifier (2) or the connection line (4) to the output (O). According to the present application, since signal received from an input (I) is amplified according to the system requirements, amplified signal is able to be received from the output (O).

In a preferred embodiment of the present application, said high power asymmetric output switch (3) comprises at least one first matching network (3a) connected to said connection line; at least one first switching element (3d), which is connected between the first matching network (3a) and ground, and which controls the connection between the first matching network (3a) and ground; at least one second switching element (3e), which is connected between the first matching network (3a) and output (O), and which controls the connection between the first matching network (3a) and output (O); at least one second matching network (3b) connected to high power amplifier (2); at least one third switching element (3f), which is connected between the second matching network (3b) and ground, and which controls the connection between the second matching network (3b) and ground; at least one third matching network (3c) which connects second matching network (3b) to the output (O). In this embodiment, when an amplified signal is received from the high power amplifier (2), first switching element (3d), second switching element (3e) and third switching element (3f) enables connection between the high power amplifier (2) and the output (O), and disables connection between the connection line (4) and output (O). Similarly, when an amplified signal is received from the connection line (4), first switching element (3d), second switching element (3e) and third switching element (3f) enables connection between the connection line (4) and the output (O), and disables connection between the high power amplifier (2) and output (O). In these situations, first matching network (3a), second matching network (3b) and third matching network (3c) ensures that impedance seen from the output (O) remains same. Therefore, impedance requirement of the system is satisfied both narrow band, high power mode and wide band mode.

Figure 3:
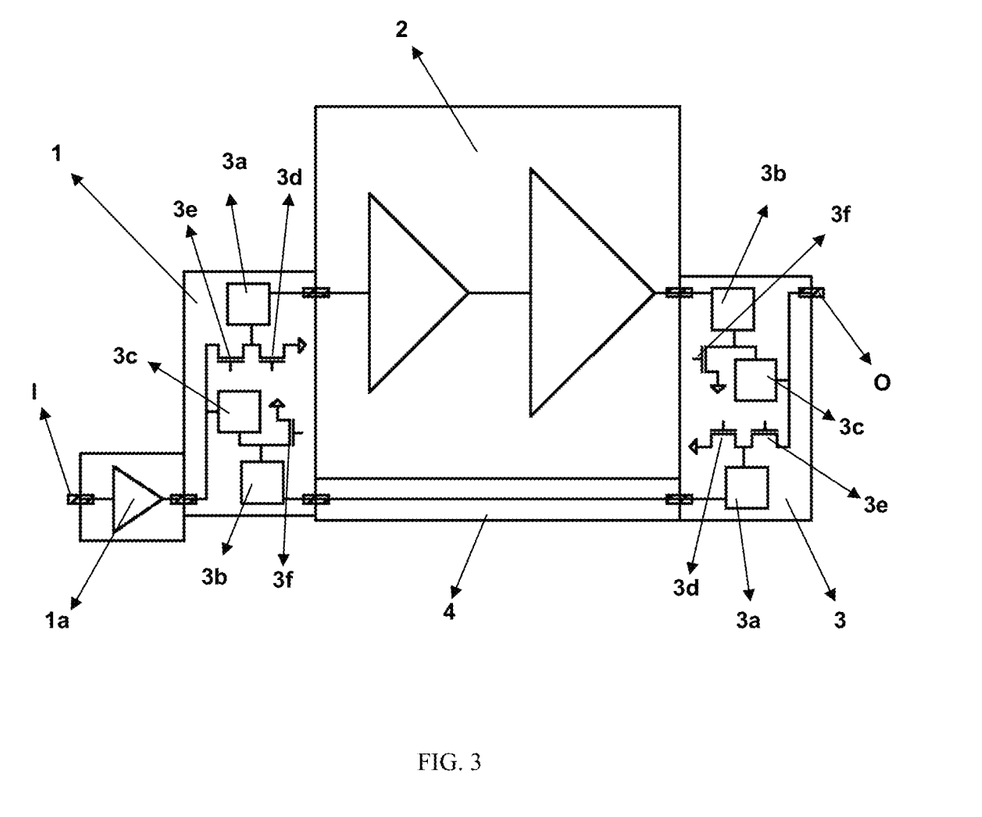
FIG. 3; is block diagram of another alternative embodiment of the power amplifier of the present application.
Figure 4:
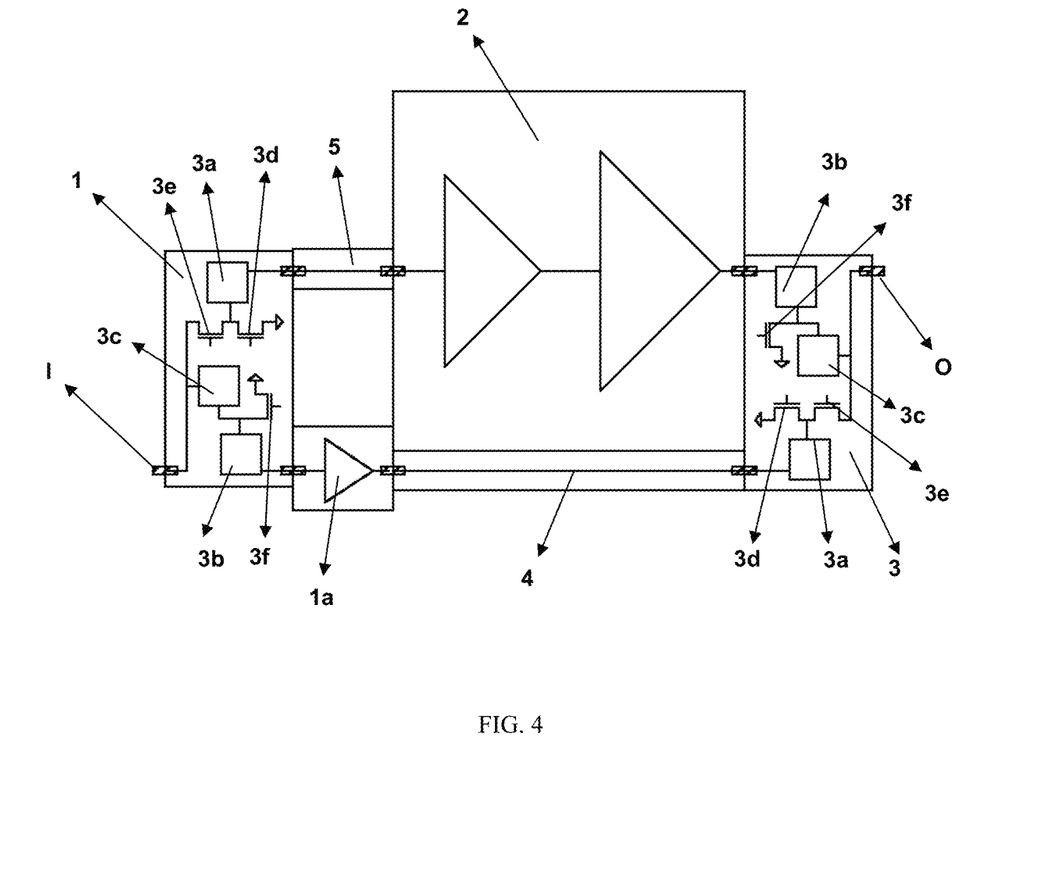
FIG. 4; is block diagram of another alternative embodiment of the power amplifier of the present application.

Two alternative embodiments of the present application are given in FIGS. 3 and 4. In these embodiments, structure of the input block (1) is same as the output block (2) with inverted connections. In other words input block (1) comprises, at least one first matching network (3a) connected to said high power amplifier (2); at least one first switching element (3d), which is connected between the first matching network (3a) and ground, and which controls the connection between the first matching network (3a) and ground; at least one second switching element (3e), which is connected between the first matching network (3a) and input (I), and which controls the connection between the first matching network (3a) and input (I); at least one second matching network (3b) connected to connection line (4); at least one third switching element (3f), which is connected between the second matching network (3b) and ground, and which controls the connection between the second matching network (3b) and ground; at least one third matching network (3c) which connects second matching network (3b) to the input (I). Said input block (1) further comprises at least one first amplifier element (1a) connected between the input (I) and third matching network (3c), as shown in FIG. 3. Alternatively, as shown in FIG. 4, input block (1) further comprises at least one first amplifier element (1a) connected between the second matching network (3b) and connection line (4), and at least one balancing line (5) (preferably a line having 50 Ohm characteristic impedance) between the first matching network (3a) and high power amplifier (2).

Figure 1:
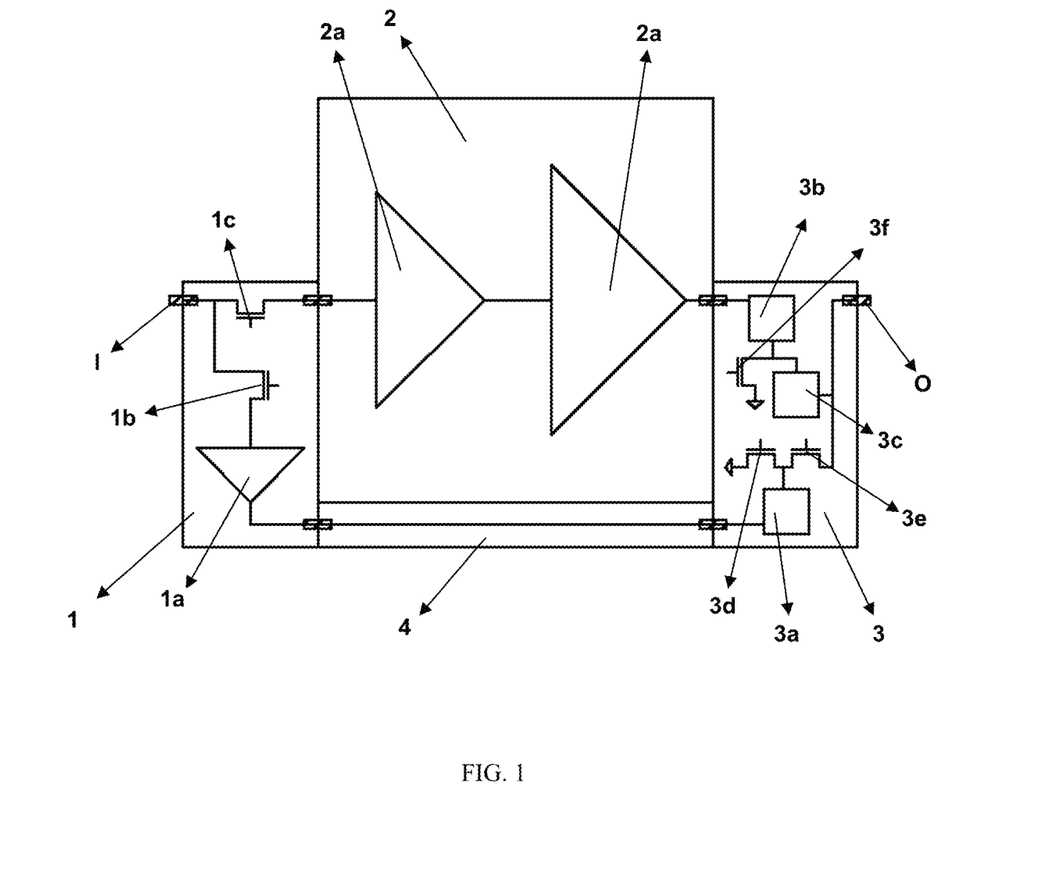
FIG. 1; is block diagram of the power amplifier of the present application.

In another preferred embodiment of the present application, which is shown in FIG. 1 said input block (1) comprises at least one first amplifier element (1a), which is connected to connection line (4); at least one forth switching element (1b) which controls connection between the input (I) and first amplifier element (1a); and at least one fifth switching element (1c) which controls connection between the input (I) and the high power amplifier (2). In this embodiment, when narrow band, high power mode is needed, signal coming from the input (I) is sent to only the high power amplifier (2). Therefore, signal coming from the input (I) is amplified by the high power amplifier. Similarly, when wide band mode is needed, signal coming from the input (I) is sent to only the connection line (4). Therefore, signal coming from the input (I) is amplified by the first amplifier element (1a) and sent to the high power asymmetric output switch (3) through connection line (4).

Figure 2:
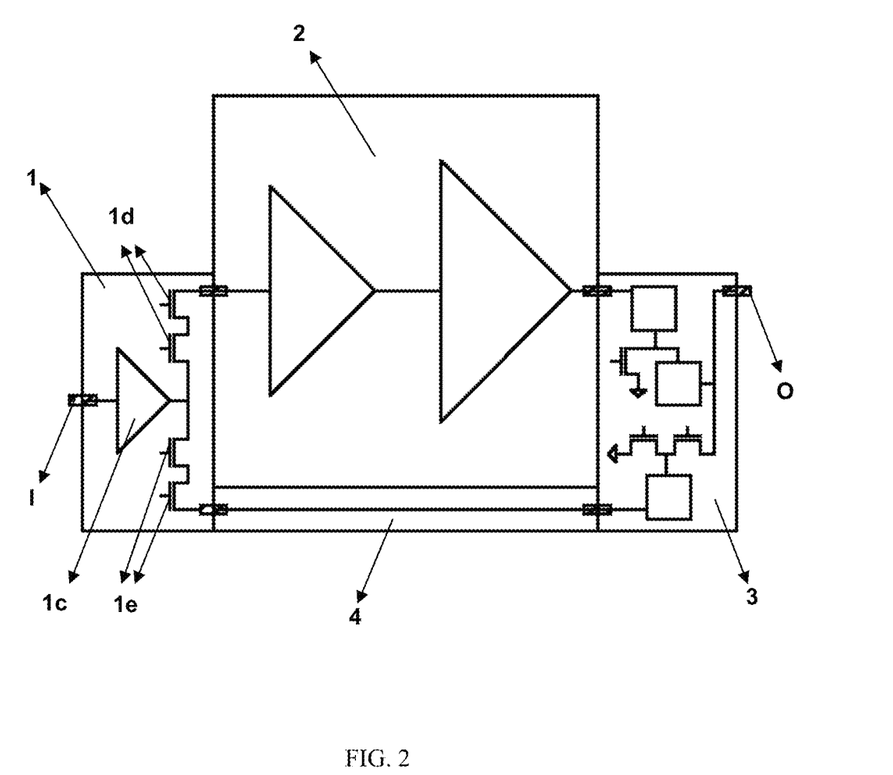
FIG. 2; is block diagram of an alternative embodiment of the power amplifier of the present application.

In an alternative embodiment of the present application, which is shown in FIG. 2, said input block (1) comprises at least one first amplifier element (1a), which is connected to the input (1); at least one sixth switching element (1d) which controls connection between first amplifier element (1a) and high power amplifier (2); and at least one seventh switching element (1e) which controls connection between first amplifier element (1a) and the connection line (4). In this embodiment, signal coming from the input (I) is firstly amplified by the first amplifier element (1a), and amplified signal is sent to either high power amplifier (2) or connection line (4) according to system requirements. In this embodiment, structure of the high power asymmetric output switch (3) is preferably same as the embodiment shown in FIG. 1.

In another preferred embodiment of the present application high power amplifier (2) comprises at least one second amplifier element (2a). In this embodiment, said second amplifier element (2a) is suitable to amplify signals with narrow band and high power and high efficiency. Therefore, narrow band, high power and high efficiency requirement of the system is satisfied by the high power amplifier (2).

In another preferred embodiment of the present application, first amplifier element (1a) suitable to amplify wideband signals (for example in the form of a HEMT). Therefore, wideband requirement of the system is satisfied by the input block (1).

In another preferred embodiment of the present application, input block (1), high power amplifier (2), high power asymmetric output switch (3) and connection line (4) are distinct elements. In an alternative embodiment of the present application, power amplifier system is in the single chip form. In other words, input block (1), high power amplifier (2), high power asymmetric output switch (3) and connection line (4) are placed on a single chip.

In the present application, by using input block (1), high power amplifier (2), high power asymmetric output switch (3) and connection line (4) together, power amplifier system is able to be operated either narrow band with high power efficiency or wideband. Therefore, according to the system needs, in input signal is amplified without reducing the output power and efficiency of the narrow band mode and without reducing the bandwidth in the wideband mode.

What is claimed is:

1. A power amplifier system for amplifying a power of an electrical signal, comprising;
at least one high power amplifier,
at least one connection line,
at least one input block which receives at least one signal from an input, wherein the at least one input block is connected to the at least one high power amplifier and the at least one connection line, the at least one input block sends received signal to either the at least one high power amplifier or the at least one connection line and the power of the signal is amplified prior to sending to the connection line, and
at least one high power asymmetric output switch which is connected to the at least one high power amplifier and the at least one connection line and the at least one high power asymmetric output switch sends a plurality of signals coming from the at least one high power amplifier and the at least one connection line to an output, wherein the at least one high power asymmetric output switch comprises at least one first matching network connected to the at least one connection line; at least one first switching element, wherein the at least one first switching element is connected between the at least one first matching network and ground, and controls a connection between the at least one first matching network and ground; at least one second switching element, wherein the at least one second switching element is connected between the at least one first matching network and the output, and controls a connection between the at least one first matching network and the output; at least one second matching network connected to the at least one high power amplifier; at least one third switching element, wherein the at least one third switching element is connected between the at least one second matching network and ground, and controls a connection between the at least one second matching network and ground; at least one third matching network connects the at least one second matching network to the output.

2. The power amplifier system according to claim 1, wherein the at least one input block is directly connected to the at least one high power amplifier, the at least one high power asymmetric output switch is directly connected to the at least one high power amplifier, and the at least one connection line is directly connected to the at least one input block and the at least one high power asymmetric output switch.

3. A power amplifier system for amplifying a power of an electrical signal, comprising;
at least one high power amplifier,
at least one connection line,
at least one input block which receives at least one signal from an input, wherein the at least one input block is connected to the at least one high power amplifier and the at least one connection line, the at least one input block sends received signal to either the at least one high power amplifier or the at least one connection line and the power of the signal is amplified prior to sending to the connection line, and
at least one high power asymmetric output switch which is connected to the at least one high power amplifier and the at least one connection line and the at least one high power asymmetric output switch sends a plurality of signals coming from the at least one high power amplifier and the at least one connection line to an output, wherein the at least one input block comprises at least one first matching network connected to the at least one high power amplifier; at least one first switching element, wherein the at least one first switching element is connected between the at least one first matching network and ground, and controls a connection between the at least one first matching network and ground; at least one second switching element, wherein the at least one second switching element is connected between the at least one first matching network and the input, and controls a connection between the at least one first matching network and the input; at least one second matching network connected to the at least one connection line; at least one third switching element, wherein the at least one third switching element is connected between the at least one second matching network and ground, and controls a connection between the at least one second matching network and ground; at least one third matching network, wherein the at least one third matching network connects the at least one second matching network to the input.

4. The power amplifier system according to claim 3, wherein the at least one input block further comprises at least one first amplifier element connected between the input and the at least one third matching network.

5. The power amplifier system according to claim 3, wherein the at least one input block further comprises at least one first amplifier element connected between the at least one second matching network and the at least one connection line, and at least one balancing line between the at least one first matching network and the at least one high power amplifier.

6. The power amplifier system according to claim 1, wherein the at least one input block comprises at least one first amplifier element, wherein the at least one first amplifier element is connected to the at least one connection line; at least one fourth switching element which controls connection between the input and the at least one first amplifier element; and at least one fifth switching element which controls connection between the input and the at least one high power amplifier.

7. A power amplifier system for amplifying a power of an electrical signal, comprising;
- at least one high power amplifier,
- at least one connection line,
- at least one input block which receives at least one signal from an input, wherein the at least one input block is connected to the at least one high power amplifier and the at least one connection line, the at least one input block sends received signal to either the at least one high power amplifier or the at least one connection line and the power of the signal is amplified prior to sending to the connection line, and
- at least one high power asymmetric output switch which is connected to the at least one high power amplifier and the at least one connection line and the at least one high power asymmetric output switch sends a plurality of signals coming from the at least one high power amplifier and the at least one connection line to an output, wherein the at least one input block comprises at least one first amplifier element, wherein the at least one first amplifier element is connected to the input; at least one sixth switching element which controls connection between the at least one first amplifier element and the at least one high power amplifier; and at least one seventh switching element which controls connection between the at least one first amplifier element and the at least one connection line.

8. The power amplifier system according to claim 4, wherein the at least one first amplifier element is in a form of a HEMT.

9. The power amplifier system according to claim 1, wherein the at least one input block, the at least one high power amplifier, the at least one high power asymmetric output switch and the at least one connection line are distinct elements.

10. The power amplifier system according to claim 1, wherein the at least one input block, the at least one high power amplifier, the at least one high power asymmetric output switch and the at least connection line are placed on a single chip.

11. The power amplifier system according to claim 3, wherein the at least one high power asymmetric output switch comprises at least one first matching network connected to the at least one connection line; at least one first switching element, wherein the at least one first switching element is connected between the at least one first matching network and ground, and controls a connection between the at least one first matching network and ground; at least one second switching element, wherein the at least one second switching element is connected between the at least one first matching network and the output, and controls a connection between the at least one first matching network and the output; at least one second matching network connected to the at least one high power amplifier; at least one third switching element, wherein the at least one third switching element is connected between the at least one second matching network and ground, and controls a connection between the at least one second matching network and ground; at least one third matching network connects the at least one second matching network to the output.

12. The power amplifier system according to claim 6, wherein the at least one high power asymmetric output switch comprises at least one first matching network connected to the at least one connection line; at least one first switching element, wherein the at least one first switching element is connected between the at least one first matching network and ground, and controls a connection between the at least one first matching network and ground; at least one second switching element, wherein the at least one second switching element is connected between the at least one first matching network and the output, and controls a connection between the at least one first matching network and the output; at least one second matching network connected to the at least one high power amplifier; at least one third switching element, wherein the at least one third switching element is connected between the at least one second matching network and ground, and controls a connection between the at least one second matching network and ground; at least one third matching network connects the at least one second matching network to the output.

13. The power amplifier system according to claim 7, wherein the at least one high power asymmetric output switch comprises at least one first matching network connected to the at least one connection line; at least one first switching element, wherein the at least one first switching element is connected between the at least one first matching network and ground, and controls a connection between the at least one first matching network and ground; at least one second switching element, wherein the at least one second switching element is connected between the at least one first matching network and the output, and controls a connection between the at least one first matching network and the output; at least one second matching network connected to the at least one high power amplifier; at least one third switching element, wherein the at least one third switching element is connected between the at least one second matching network and ground, and controls a connection between the at least one second matching network and ground; at least one third matching network connects the at least one second matching network to the output.

14. The power amplifier system according to claim 8, wherein the at least one input block further comprises at least one first amplifier element connected between the at least one second matching network and the at least one connection line, and at least one balancing line between the at least one first matching network and the at least one high power amplifier.

15. The power amplifier system according to claim 8, wherein the at least one input block comprises at least one first amplifier element, wherein the at least one first amplifier element is connected to the at least one connection line; at least one forth switching element which controls connection between the input and the at least one first amplifier element; and at least one fifth switching element which controls connection between the input and the at least one high power amplifier.

16. The power amplifier system according to claim 8, wherein the at least one input block comprises at least one first amplifier element, wherein the at least one first amplifier element is connected to the input; at least one sixth switching element which controls connection between the at least one first amplifier element and the at least one high power amplifier; and at least one seventh switching element which controls connection between the at least one first amplifier element and the at least one connection line.

17. The power amplifier system according to claim 1, wherein the at least one input block is directly connected to the at least one high power amplifier.

18. The power amplifier system according to claim 1, wherein the at least one high power asymmetric output switch is directly connected to the at least one high power amplifier.

19. The power amplifier system according to claim 1, wherein the at least one connection line is directly connected to the at least one input block and the at least one high power asymmetric output switch.

* * * * *